US006556647B1

(12) United States Patent
Neravetla

(10) Patent No.: US 6,556,647 B1
(45) Date of Patent: Apr. 29, 2003

(54) PHASE LOCKED LOOP CLOCK DIVIDER UTILIZING A HIGH SPEED PROGRAMMABLE LINEAR FEEDBACK SHIFT REGISTER WITH A TWO STAGE PIPELINE FEEDBACK PATH

(75) Inventor: Karthik Reddy Neravetla, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/137,079

(22) Filed: May 1, 2002

Related U.S. Application Data

(63) Continuation-in-part of application No. 09/960,590, filed on Sep. 21, 2001, now Pat. No. 6,424,691.

(51) Int. Cl.[7] ............................................. G11C 19/00
(52) U.S. Cl. ............................ 377/70; 377/75; 377/80; 377/81
(58) Field of Search .............................. 377/70, 80, 81, 377/75

(56) References Cited

U.S. PATENT DOCUMENTS 6,424,691 B1 * 7/2002 Neravetla et al. ............. 377/48

* cited by examiner

Primary Examiner—Margaret R. Wambach
(74) Attorney, Agent, or Firm—Davis Munck, P.C.

(57) ABSTRACT

An apparatus and method is disclosed for providing a phase locked loop clock divider circuit utilizing a high speed linear feedback shift register with a two stage pipeline in its feedback path. A plurality of "pre-load" flip flop (PLFF) circuits and multiplexers are coupled to a plurality of linear feedback shift register (LFSR) flip flop circuits and multiplexers. The PLFF circuits hold pre-calculated initial LFSR sequence values to be loaded into the LFSR flip flop circuits. The load enable signal to the PLFF multiplexers and to the LFSR multiplexers is low for three successive input clock cycles. The present invention is capable of operating at high frequencies due to a shortened timing critical feedback path.

29 Claims, 3 Drawing Sheets

PHASE LOCKED LOOP CLOCK DIVIDER UTILIZING A HIGH SPEED PROGRAMMABLE LINEAR FEEDBACK SHIFT REGISTER WITH A TWO STAGE PIPELINE FEEDBACK PATH

CROSS REFERENCE TO RELATED APPLICATION

This patent application is related to and claims priority as a continuation-in-part of U.S. patent application Ser. No. 09/960,590 entitled PHASE LOCKED LOOP CLOCK DIVIDER UTILIZING A HIGH SPEED PROGRAMMABLE LINEAR FEEDBACK SHIFT REGISTER filed on Sep. 21, 2001, now U.S. Pat. No. 6,424,691. U.S. patent application Ser. No. 09/960,590 is commonly assigned to the assignee of the present patent application. The disclosures of U.S. patent application Ser. No. 09/960,590 are hereby incorporated by reference in the present patent application as if fully set forth herein.

FIELD OF THE INVENTION

The present invention relates generally to integrated circuits. More particularly, the present invention relates to an improved apparatus and method for providing a phase locked loop clock divider circuit that utilizes a high speed programmable linear feedback shift register with a two stage pipeline in its feedback path.

BACKGROUND OF THE INVENTION

The use of linear feedback shift registers is well known in integrated circuit technology. Linear feedback shift registers may be used in a number of applications. For example, a linear feedback shift register may be used to implement a clock divider circuit. A clock divider circuit is used to divide a master clock signal to obtain a lower frequency clock signal.

In a phase locked loop (PLL) circuit, a clock divider circuit located within the feedback path needs to run at the frequency of the voltage controlled oscillator (VCO) in the PLL. The function of the PLL clock divider circuit in the feedback path is to divide the VCO frequency by a programmable value N (referred to as the "register value"). Division of the VCO frequency by the register value N provides an input to the phase detector within an analog core of the PLL. This causes a closed loop to be formed within the PLL. Clock divider circuits in the feedback path of a PLL are typically binary based counters or linear feedback shift register (LFSR) based counters.

High frequency PLL circuits have voltage controlled oscillators (VCO) that operate at very high frequencies. This, in turn, requires that the clock divider circuit in the feedback path of the PLL must also operate at very high frequencies. Prior art high frequency PLL circuits that have high frequency VCO output typically use custom designed binary counters or LFSR based counters in the feedback path that typically operate in the range of 250 MHz to 500 MHz. LFSR based counters operate at a relatively higher frequency compared to custom designed binary counters. To make prior art LFSR based counters to operate at frequencies greater than 500 MHz, the timing critical LFSR feedback path must have not more than one logic gate.

It would be desirable to have a high frequency PLL circuit having an LFSR based counter as a clock divider in its feedback path that would operate efficiently at frequencies greater than 500 MHz.

It would also be desirable to have a high frequency PLL circuit having an LFSR based counter as a clock divider in its feedback path with a shorter critical timing path than prior art LFSR based counters.

It would also be desirable to have a high frequency PLL circuit having an LFSR based counter as a clock divider in its feedback path having only one logic gate present in the critical timing path of the LFSR based counter.

SUMMARY OF THE INVENTION

The present invention is directed to an apparatus and method for providing a phase locked loop clock divider circuit that utilizes a high speed programmable linear feedback shift register (LFSR) with a two stage pipeline in its feedback path.

One advantageous embodiment of the present invention comprises (1) a linear feedback shift register (LFSR) based counter comprising a plurality of linear feedback shift register (LFSR) units and multiplexers, and (2) a plurality of "pre-load" flip flop (PLFF) circuits and multiplexers. Pre-calculated initial LFSR sequence values are stored in the "pre-load" flip flop circuits. The present invention generates a "load enable" signal to indicate when to load the pre-calculated initial LFSR sequence values into the LFSR units.

A feedback signal for the linear feedback shift register (LFSR) based counter is obtained by calculating an exclusive NOR value (XNOR) from the outputs of two of the LFSR units in the LFSR based counter. The feedback signal is obtained using a two stage pipeline in the feedback path of the LFSR based counter. The XNOR logic of the feedback path is implemented with NAND gates in each of the two pipeline stages. The feedback signal is used by a first LFSR unit (LFSR0) after three (3) successive input clock cycles from the falling edge of a "load enable" signal in order to compensate for the two stage pipeline delay introduced into the feedback path.

It is an object of the present invention to provide an apparatus and method for providing a phase locked loop clock divider circuit that utilizes a high speed linear feedback shift register with a two stage pipeline in its feedback path that does not need to employ as many logic gates in a timing critical feedback path as prior art linear feedback shift registers.

It is another object of the present invention to provide an apparatus and method for providing a phase locked loop clock divider circuit that utilizes a high speed linear feedback shift register with a two stage pipeline in its feedback path that is capable of operating at high frequencies.

It is also an object of the present invention to provide an apparatus and method for providing a phase locked loop clock divider circuit that utilizes a high speed linear feedback shift register with a two stage pipeline in its feedback path that is capable of operating at a faster rate than prior art linear feedback shift registers.

It is another object of the present invention to provide an apparatus and method for providing a phase locked loop clock divider circuit that utilizes a high speed linear feedback shift register with a two stage pipeline in its feedback path to have a scalable design that can implement an "any bit" clock divider having only two bits in its polynomial equation.

It is yet another object of the present invention to provide an apparatus and method for providing a phase locked loop clock divider circuit that utilizes a high speed linear feedback shift register with a two stage pipeline in its feedback path that is capable of generating desired frequencies for a clock divide signal by using non-timing critical "pre-load" flip flop circuits.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain -words and phrases are provided throughout this patent document. Those of ordinary skill should understand that in many instances (if not in most instances), such definitions apply to prior uses, as well as to future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
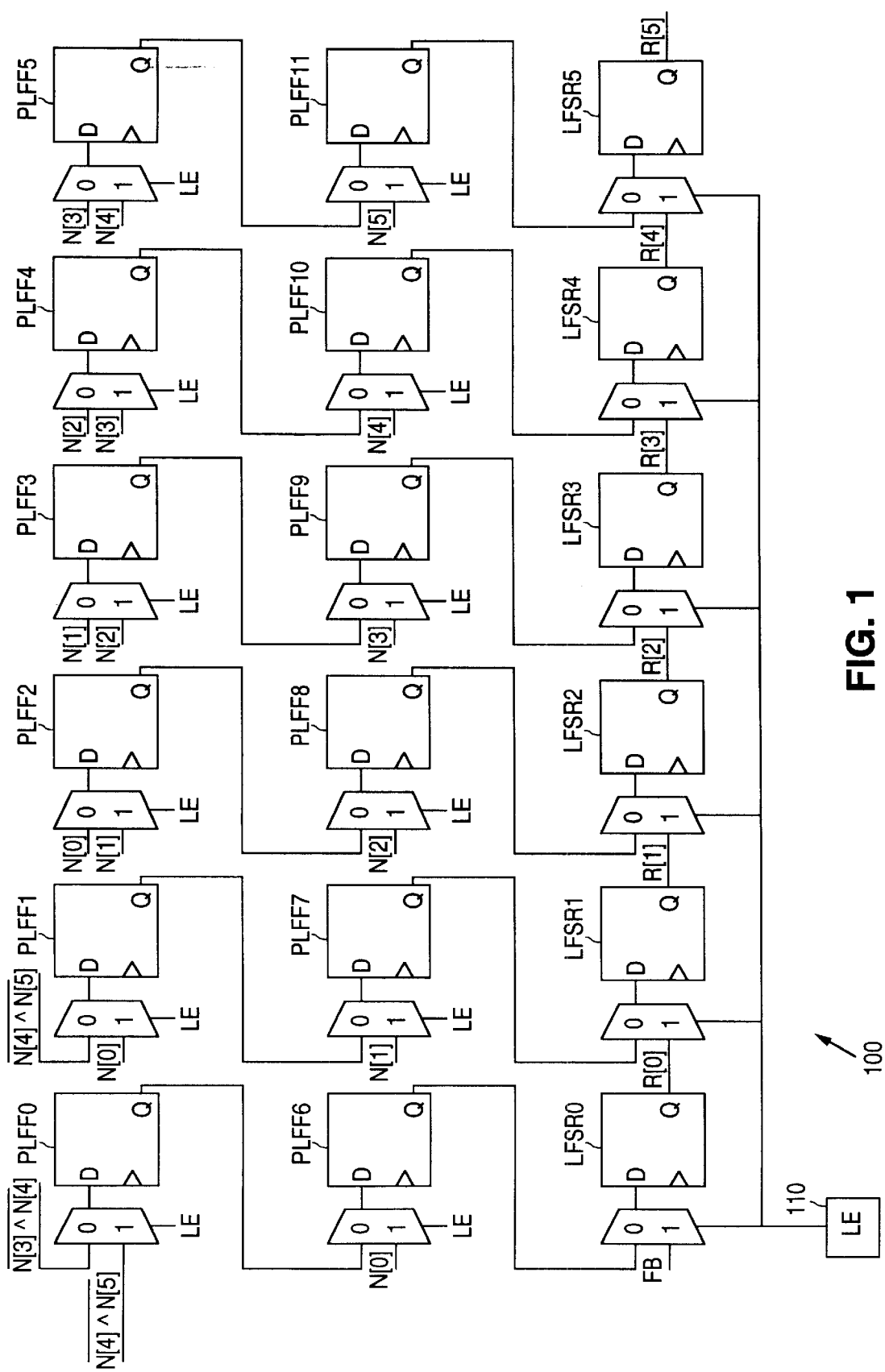
FIG. 1 schematically illustrates a first portion of an exemplary six (6) bit PLL clock divider circuit utilizing a high speed programmable linear feedback shift register with a two stage pipeline in its feedback path with load enable generation using eleven (11) flip flop circuits according to an advantageous embodiment of the present invention.
Figure 2:
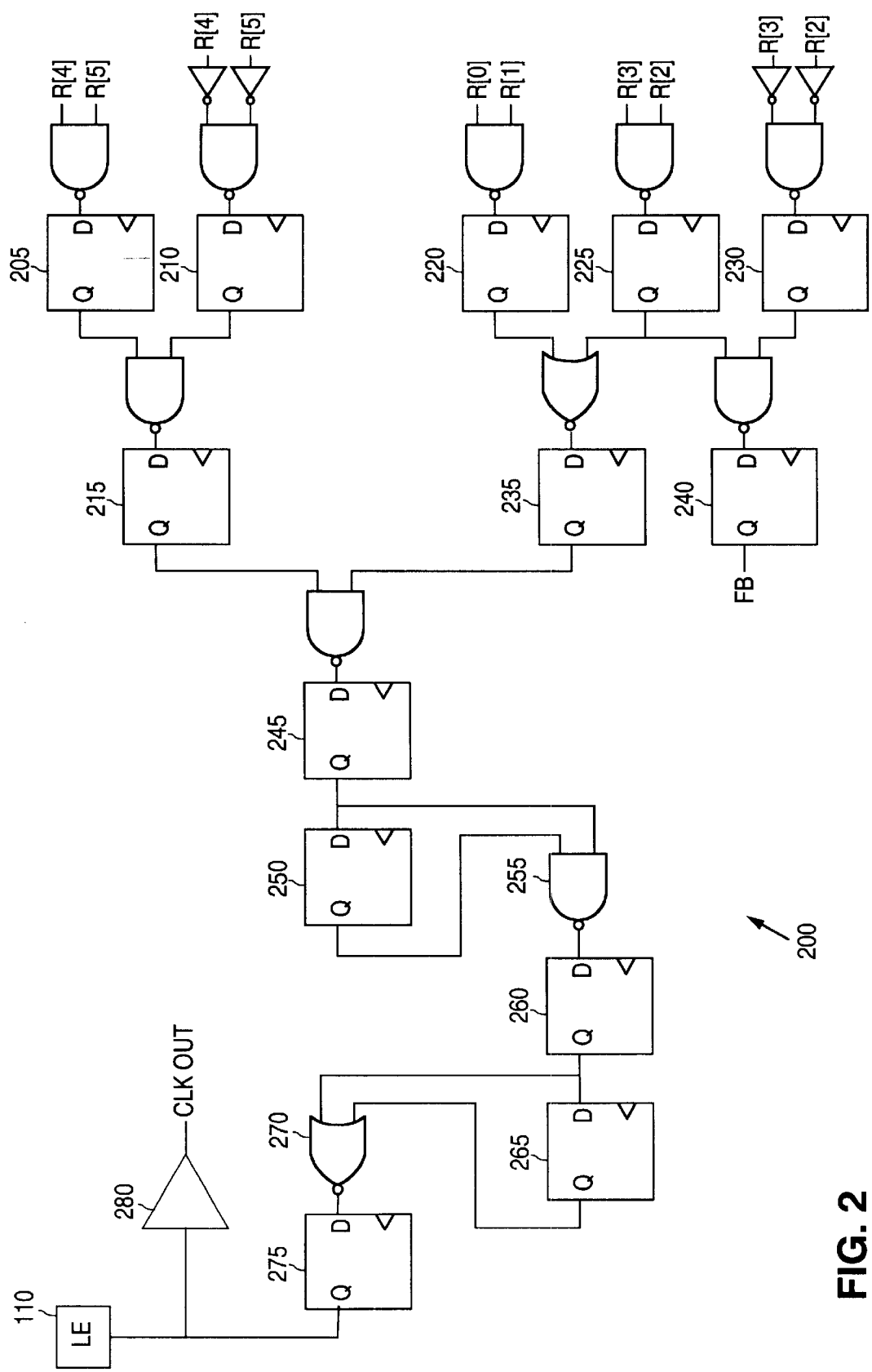
FIG. 2 schematically illustrates a second portion of the exemplary six (6) bit PLL clock divider circuit shown in FIG. 1 utilizing a high speed programmable linear feedback shift register with a two stage pipeline in its feedback path.
Figure 3:
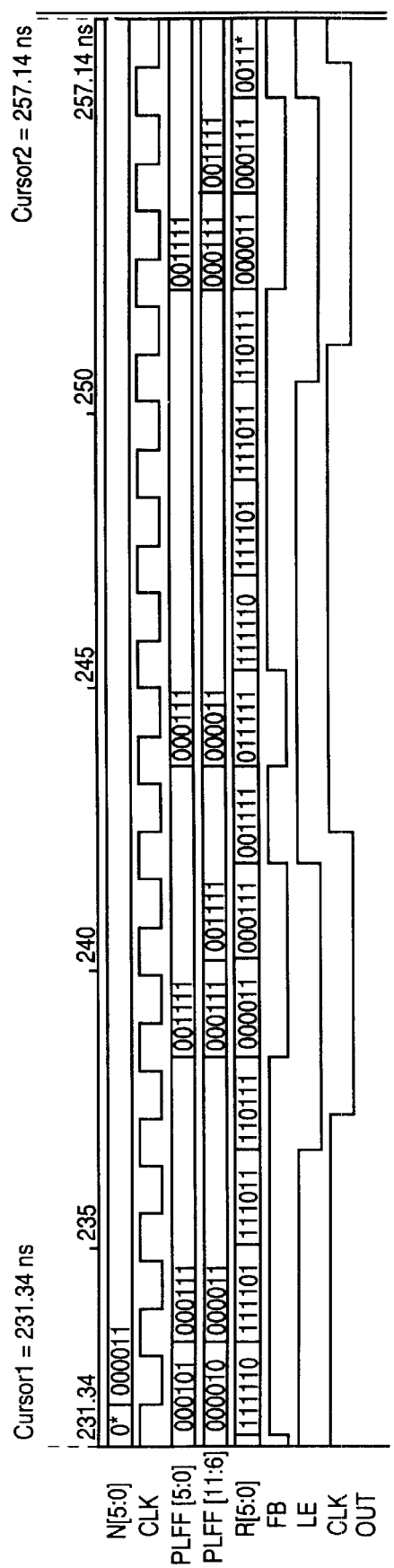
FIG. 3 schematically illustrates a timing diagram showing an operation of the exemplary six (6) bit PLL clock divider circuit shown in FIG. 1 and FIG. 2.

FIGS. 1 through 3, discussed below, and the various, embodiments used to describe the principles of the present invention in this patent document are by way of illustration only and should not be construed in any way to limit the scope of the invention. Those skilled in the art will understand that the principles of the present invention may be implemented in any suitably arranged linear feedback shift register.

In particular, the present invention will be described with reference to an exemplary linear feedback shift register (LFSR) that receives six (6) inputs, N[I], where the index I takes on integer values from zero (0) to five (5). It is understood that the present invention is not limited to use in an LFSR circuit having exactly six (6) bits. The present invention may be easily extended to an LFSR circuit having more than six (6) bits or fewer than six (6) bits when there are only two (2) bits in the polynomial equation of the LFSR circuit.

The present invention provides an apparatus and method for providing a phase locked loop clock divider circuit that utilizes a high speed programmable linear feedback shift register with a two stage pipeline in its feedback path.

FIG. 1 schematically illustrates a first portion of an exemplary six (6) bit PLL clock divider circuit utilizing a high speed programmable linear feedback shift register (LFSR) 100 of the present invention. The first portion of the exemplary six (6) bit PLL clock divider circuit shown in FIG. 1 comprises eighteen (18) flip flop circuits and eighteen (18) multiplexers. A clock signal from a voltage controlled oscillator (VCO) (not shown) is provided as a clock input signal to all of the eighteen (18) flip flop circuits shown in FIG. 1. Circuitry that provides the VCO clock signal to each of the eighteen (18) flip flop circuits is not shown in FIG. 1.

Each of the eighteen (18) flip flop circuits of LFSR 100 has a "D" input that is coupled to an output of an immediately preceding multiplexer circuit. As shown in FIG. 1, each multiplexer circuit has an "enable" input signal line for receiving a "load enable" (LE) signal. The generation of the LE signal for LFSR 100 will be discussed below in more detail.

The first row of flip flop circuits shown in FIG. 1 comprises a first set of six (6) "pre-load" flip flop circuits (designated PLFF0 through PLFF5). The second row of flip flop circuits comprises a second set of six (6) "pre-load" flip flop circuits (designated PLFF6 through PLFF11). The third row of flip flop circuits comprises a set of six (6) linear feedback shift register units (designated LFSR0 through LFSR5).

Each "pre-load" flip flop circuit in the first row of "pre-load" flip flop circuits (PLFF0 through PLFF5) has a "Q" output that is coupled to a "0" input of a multiplexer that immediately precedes a corresponding "pre-load" flip flop circuit in the second row of "pre-load" flip flop circuits (PLFF6 through PLFF11). For example, the "Q" output of "pre-load" flip flop circuit PLFF0 is coupled to the "0" input of the multiplexer that immediately precedes "pre-load" flip flop circuit PLFF6. The same arrangement exists for each corresponding pair, PLFF1 and PLFF7, PLFF2 and PLFF8, PLFF3 and PLFF9, PLFF4 and PLFF10, and PLFF5 and PLFF11.

Each "pre-load" flip flop circuit in the second row of "pre-load" flip flop circuits (PLFF6 through PLFF11) has a "Q" output that is coupled to a "0" input of a multiplexer that immediately precedes a corresponding linear feedback shift register unit in the row of linear feedback shift register units (LSFR0 through LSFR5). For example, the "Q" output of "pre-load" flip flop circuit PLFF6 is coupled to the "0" input of the multiplexer that immediately precedes linear feedback shift register unit LFSR0. The same arrangement exists for each corresponding pair, PLFF7 and LFSR1, PLFF8 and LFSR2, PLFF9 and LFSR3, PLFF10 and LFSR4, and PLFF11 and LFSR5.

Each linear feedback shift register unit has a "Q" output that is coupled to the "1" input of a multiplexer that immediately precedes the next linear feedback shift register unit. For example, the "Q" output of linear feedback shift register unit LFSR0 is coupled to the "1" input of a multiplexer that immediately precedes linear feedback shift register unit LFSR1. The value of the output signal on the "Q" output of LFSR0 is designated R[0]. Similarly, the value of the output signal on the "Q" output of LFSR1 is designated R[1]. The same type of designation exists for each LFSR unit up to LFSR5.

The input register values, N[0] through N[5], are provided to the "pre-load" flip flop circuits, PLFF0 through PLFF11, as indicated in FIG. 1. The "pre-load" flip flop circuits (and their associated multiplexers) are not located in a timing critical path. The input register values that are provided to the "pre-load" flip flop circuits are static. Their values do not change during a particular application. Therefore, it is not critical to minimize the number of logic gates in between the "pre-load" flip flop circuits.

The "0" input of the multiplexer that immediately precedes PLFF0 is provided with a signal that represents the result of an exclusive NOR operation between the input register value N[3] and the input register value N[4]. This signal is represented in FIG. 1 by the expression $\overline{N[3]^\wedge N[4]}$. The exclusive NOR operation may be implemented with a multiplexer circuit.

The "1" input of the multiplexer that immediately precedes PLFF0 is provided with a signal that represents the result of an exclusive NOR operation between the input register value N[4] and the input register value N[5]. This signal is represented in FIG. 1 by the expression $\overline{N[4]^\wedge N[5]}$. The exclusive NOR operation may be implemented with a multiplexer circuit.

The "0" input of the multiplexer that immediately precedes PLFF1 is provided with a signal that represents the result of an exclusive NOR operation between the input register value N[4] and the input register value N[5]. This signal is represented in FIG. 1 by the expression $\overline{N[4]^\wedge N[5]}$. The exclusive NOR operation may be implemented with a multiplexer circuit. The "1" input of the multiplexer that immediately precedes PLFF1 is provided with the input register value N[0].

The "0" input of the multiplexer that immediately precedes PLFF2 is provided with the input register value N[0]. The "1" input of the multiplexer that immediately precedes PLFF2 is provided with the input register value N[1].

The "0" input of the multiplexer that immediately precedes PLFF3 is provided with the input register value N[1]. The "1" input of the multiplexer that immediately precedes PLFF3 is provided with the input register value N[2].

The "0" input of the multiplexer that immediately precedes PLFF4 is provided with the input register value N[2]. The "1" input of the multiplexer that immediately precedes PLFF4 is provided with the input register value N[3].

The "0" input of the multiplexer that immediately precedes PLFF5 is provided with the input register value N[3]. The "1" input of the multiplexer that immediately precedes PLFF5 is provided with the input register value N[4].

The "0" input of the multiplexer that immediately precedes PLFF6 is provided with the "Q" output signal from PLFF0. The "1" input of the multiplexer that immediately precedes PLFF6 is provided with the input register value N[0].

The "0" input of the multiplexer that immediately precedes PLFF7 is provided with the "Q" output signal from PLFF1. The "1" input of the multiplexer that immediately precedes PLFF7 is provided with the input register value N[1].

The "0" input of the multiplexer that immediately precedes PLFF8 is provided with the "Q" output signal from PLFF2. The "1" input of the multiplexer that immediately precedes PLFF8 is provided with the input register value N[2].

The "0" input of the multiplexer that immediately precedes PLFF9 is provided with the "Q" output signal from PLFF3. The "1" input of the multiplexer that immediately precedes PLFF9 is provided with the input register value N[3].

The "0" input of the multiplexer that immediately precedes PLFF10 is provided with the "Q" output signal from PLFF4. The "1" input of the multiplexer that immediately precedes PLFF10 is provided with the input register value N[4].

The "0" input of the multiplexer that immediately precedes PLFF11 is provided with the "Q" output signal from PLFF5. The "1" input of the multiplexer that immediately precedes PLFF11 is provided with the input register value N[5].

The "0" input of the multiplexer that immediately precedes LFSR0 is provided with the "Q" output signal from PLFF6. The "1" input of the multiplexer that immediately precedes LFSR0 is provided with the feedback (FB) signal.

The "0" input of the multiplexer that immediately precedes LFSR1 is provided with the "Q" output signal from PLFF7. The "1" input of the multiplexer that immediately precedes LFSR1 is provided with the "Q" output signal from LFSR0 designated R[0].

The "0" input of the multiplexer that immediately precedes LFSR2 is provided with the "Q" output signal from PLFF8. The "1" input of the multiplexer that immediately precedes LFSR2 is provided with the "Q" output signal from LFSR1 designated R[1].

The "0" input of the multiplexer that immediately precedes LFSR3 is provided with the "Q" output signal from PLFF9. The "1" input of the multiplexer that immediately precedes LFSR3 is provided with the "Q" output signal from LFSR2 designated R[2].

The "0" input of the multiplexer that immediately precedes LFSR4 is provided with the "Q" output signal from PLFF10. The "1" input of the multiplexer that immediately precedes LFSR4 is provided with the "Q" output signal from LFSR3 designated R[3].

The "0" input of the multiplexer that immediately precedes LFSR5 is provided with the "Q" output signal from PLFF11. The "1" input of the multiplexer that immediately precedes LFSR5 is provided with the "Q" output signal from LFSR4 designated R[4]. The output signal on the "Q" output of LFSR5 is designated R[5].

FIG. 2 schematically illustrates a second portion 200 of the exemplary six (6) bit PLL clock divider circuit utilizing a high speed programmable linear feedback shift register with a two stage pipeline in its feedback path. The generation of the feedback (FB) signal is implemented using NAND logic on the outputs of LFSR2 and LFSR3 in two pipeline stages (using flip flop circuit 225, flip flop circuit 230, and flip flop circuit 240).

Specifically, the output R[2] of LFSR2 and the output R[3] of LFSR3 are provided to the inputs of a NAND gate having its output connected to the "D" input of flip flop circuit 225. The inverted output $\overline{R[2]}$ of LFSR2 and the inverted output $\overline{R[3]}$ of LFSR3 are provided to the inputs of a NAND gate having its output connected to the "D" input of flip flop circuit 230. The circuitry that provides the R[2] output and the R[3] output to the second portion 200 of the exemplary six (6) bit PLL clock divider circuit is not shown in FIG. 1 or FIG. 2. Flip flop circuit 225 and flip flop circuit 230 comprise the first pipeline stage within the feedback path.

The "Q" outputs of flip flop circuit 225 and flip flop circuit 230 are connected to the inputs of a NAND gate having its output connected to the "D" input of flip flop circuit 240. Flip flop circuit 240 comprises the second pipeline stage within the feedback path.

The output of flip flop circuit 240 represents the feedback (FB) signal for the high speed programmable linear feedback shift register of the present invention. The feedback (FB) signal is provided to the "1" input of the multiplexer that immediately precedes linear feedback shift register unit LFSR0. The circuitry that provides the feedback (FB) signal from flip flop circuit 240 to the first portion 100 of the exemplary six (6) bit PLL clock divider circuit is not shown in FIG. 1 or FIG. 2.

As will be more fully explained, other circuit elements of the second portion 200 of the exemplary six (6) bit PLL clock divider circuit shown in FIG. 2 are used to generate a load enable (LE) signal.

Unlike the present invention, prior art linear feedback shift register circuits do not utilize two (2) sets of "pre-load" flip flop circuits. In a typical prior art six (6) bit LFSR based counter, the polynomial for the feedback path is R[5]+R[4]. The plus sign "+" represents an XNOR operation (or in some implementations, an XOR operation). The expression R[5] refers to the output of the LFSR5 unit and the expression R[4] refers to the output of the LFSR4 unit. In a prior art LFSR based counter, the outputs from LFSR5 and LFSR4 would be applied as inputs to an exclusive NOR gate (or, alternatively, to a multiplexer) and the output of the exclusive NOR gate (or, alternatively, the output of the multiplexer) would be applied to a multiplexed "D" input of the LFSR0 unit. This arrangement, however, has two logic gates between the LFSR5 unit and the LFSR0 unit. In addition, there are also two logic gates between the LFSR4 unit and the LFSR0 unit.

Additional delay is introduced into the operation of prior art LFSR based counters due to the presence of two logic gates in a timing critical feedback path. This hinders the operation of prior art LFSR based counters in high frequency applications. Any additional delay in the feedback path of a high speed LFSR counter may be critical.

The present invention removes one multiplexer stage from the timing critical feedback path of the LFSR counter by using a two stage pipeline in the feedback path. The"Q" output of flip flop circuit 225 and the "Q" output of flip flop circuit 230 (first stage pipeline) are provided to the inputs of a NAND circuit. The output of the NAND circuit is provided tin the "D" input of flip flop circuit 240 (second stage pipeline). The output of flip flop circuit 240 is the feedback (FB) signal.

The "load enable" (LE) signal of the present invention is an "active low" signal. When the "load enable" signal is "low" (i.e., logic "0"), the "load enable" signal causes the values to be loaded into the linear feedback shift register units (LFSR0 through LFSR5) from the pre-load flip flop (PLFF) circuits. When the "load enable" signal is "high" (i.e., logic "1"), the "load enable" signal causes a set of previous stage output values of the linear feedback shift register (LFSR) units to be loaded into the linear feedback shift register units (LFSR1 through LFSR5) and the LFSR0 unit receives the feedback signal.

When the "load enable" signal has a "low" value (i.e., logic "0"), a pre-calculated LFSR sequence (based on the value of N) that has been stored in the twelve "pre-load" flip flops (PLFF0 through PLFF11) is loaded into the linear feedback shift register (LFSR) units (LFSR0 through LFSR5). When the "load enable" signal has a "high" value (i.e., logic "1") the previous stage linear feedback shift register output values are loaded into the linear feedback shift register (LFSR) units (LFSR1 through LFSR5) and the LFSR0 unit receives the feedback signal.

In this advantageous embodiment of the present invention, the exclusive NOR (XNOR) logic in the feedback path is implemented as a two stage pipeline. The XNOR logic of the feedback path is implemented with NAND gates in each of the two pipeline stages in its feedback path. In the six (6) bit LFSR based counter embodiment of the invention, the XNOR logic is implemented in two pipeline stages even though the polynomial for the LFSR feedback data is R[5]+R[4]. The XNOR logic is implemented by obtaining an XNOR value of the R[2] and R[3] outputs in two (2) pipeline stages to be used by the LFSR0 unit after three (3) input clock cycles.

Whenever the LSFR based counter starts to count on an input register value ("N"), then the LFSR sequence for the first three (3) successive clock cycles (after the falling edge of the "load enable" signal) is obtained from the calculated values that are stored in the first and second sets of "pre-load" flip flop circuits (PLFF0 through PLFF11).

It is noted that the "load enable" signal is kept "low" (i.e., logic "0") for three (3) successive input clock cycles in order to compensate for the two pipeline stage delay introduced into the feedback path. At the same time the LFSR counting sequence needs to be kept the same as it would have been if the signal in the feedback path had not been "flopped" in flip flop circuit 225 and flip flop circuit 230 (first stage pipeline) and in flip flop circuit 240 (second stage pipeline). Otherwise, (1) the "divide by" values cannot be obtained uniquely from the input register value (i.e., the N value), and (2) there will be a lot of missing "divide by" values.

When the "load enable" signal is kept "low" (i.e., logic "0") for three (3) successive input clock cycles, the LFSR sequence is generated from the data latched in the twelve (12) "pre-load" flip flop circuits (PLFF0 through PLFF11).

The calculation of the LFSR feedback data is initiated on the first input clock cycle. The LFSR feedback data then goes through the two feedback pipeline stages during the second and third successive input clock cycles.

On the fourth successive input clock cycle (after the falling edge of the "load enable" signal) that accesses the fourth LFSR sequence, (1) the "load enable" signal is "high" (i.e., logic "1"), and (2) the one bit of data from the feedback path (from flip flop circuit 240) is provided to the LFSR0 unit. The contents of the LFSR0 unit from the previous (i.e., third) LFSR cycle is provided to the LFSR1 unit. Similarly, the contents of the LFSR1 unit from the previous (i.e., third) LFSR cycle is provided to the LFSR2 unit, and so on.

These same types of data transfers occur in later input clock cycles whenever the "load enable" signal is "high" (i.e., logic "1")

In this manner the LFSR counting sequence is kept the same as the LFSR counting sequence would be without any pipelining in the LFSR feedback path. This feature guarantees that the "divide by" values can be obtained uniquely from the input register value ("N").

As previously mentioned, circuit elements of second portion 200 of the exemplary six (6) bit PLL clock divider circuit shown in FIG. 2 are capable of generating a "load enable" (LE) signal. Generation of the "load enable" (LE) signal is implemented as a NAND logic of the outputs of LFSR3, LFSR2, LFSR1, LFSR0 and an exclusive NOR output of LFSR5 and LFSR4 in five pipeline stages (using eleven flip flop circuits, 205, 210, 215, 220, 225, 235, 245, 250, 260, 265 and 275).

Specifically, a first branch of the first pipeline stage comprises flip flop circuits 205 and 210. A second branch of the first pipeline stage comprises flip flop circuits 220 and 225. A first branch of the second pipeline stage comprises flip flop circuit 215. A second branch of the second pipeline stage comprises flip flop circuit 235. The third pipeline stage comprises flip flop circuit 245. The fourth pipeline stage comprises flip flop circuit 260. The fifth pipeline stage comprises flip flop circuit 275.

The circuitry that provides the outputs R[0], R[1], R[2], R[3], R[4], and R[5] to the second portion 200 of the exemplary six (6) bit PLL clock divider circuit is not shown in FIG. 1 or FIG. 2.

The output R[4] of LFSR4 and the output R[5] of LFSR5 are provided to the inputs of a NAND gate having its output connected to the "D" input of flip flop circuit 205. The inverted output $\overline{R[4]}$ of LFSR4 and the inverted output $\overline{R[5]}$ of LFSR5 are provided to the inputs of a NAND gate having its output connected to the "D" input of flip flop circuit 210. The "Q" outputs of flip flop circuit 205 and flip flop circuit 210 are connected to the inputs of a NAND gate having its output connected to the "D" input of flip flop circuit 215.

The output R[0] of LFSR0 and the output R[1] of LFSR1 are provided to the inputs of a NAND gate having its output connected to the "D" input of flip flop circuit 220. The output R[3] of LFSR3 and the output R[2] of LFSR2 are provided to the inputs of a NAND gate having its output connected to the "D" input of flip flop circuit 225. The "Q" outputs of flip flop circuit 220 and flip flop circuit 225 are connected to the inputs of a NOR gate having its output connected to the "D" input of flip flop circuit 235.

The "Q" outputs of flip flop circuit 215 and flip flop circuit 235 are connected to the inputs of a NAND gate having its output connected to the "D" input of flip flop circuit 245.

In order to generate the "load enable" signal to be "low" (i.e., logic "0") for three successive input clock cycles, the output signal from flip flop circuit 245 (representing the result obtained from the three NAND logic pipeline stages) is sent through another pipeline stage (in the form of flip flop circuit 250). Then the output signal from flip flop circuit 245 and the output signal from flip flop circuit 250 are provided to the inputs of NAND gate 255 having its output connected to the "D" input of flip flop circuit 260.

Then the output of flip flop circuit 260 is sent through another pipeline stage (in the form of flip flop circuit 265). Then the output signal from flip flop circuit 260 and the output signal from flip flop circuit 265 are provided to the inputs of NOR gate 270 having its output connected to the "D" input of flip flop circuit 275.

The "Q" output of flip flop circuit 275 provides the "load enable" (LE) signal. The "load enable" (LE) signal is provided to buffer 280. Buffer 280 outputs the "load enable" (LE) signal as a CLK OUT signal. The "load enable" (LE) signal is also provided to LE terminal 110. LE terminal 110 provides the "load enable" (LE) signal (using circuitry not shown in FIG. 1) to each of the multiplexers connected to the "pre-load" flip flop circuits (PLFF0 through PLFF11). LE terminal 110 also provides the "load enable" (LE) signal to each of the multiplexers connected to the linear feedback shift register units (LFSR0 through LFSR5).

The advantageous embodiment of the invention shown in FIG. 1 and in FIG. 2 uses eleven (11) flip flop circuits to generate the "load enable" (LE) signal. In this advantageous embodiment of the invention (for a six (6) bit counter), all values of input register N are valid except when N equals sixty three (63) (N=63). When the value of N equals sixty three (63), the "load enable" (LE) signal is "high" all the time (as is the output clock), allowing the LFSR counter to accept any other valid value of N.

On any other valid value of N, the LFSR counter will perform the respective clock dividing function. The missing "divide by" values are 1, 2, 3, 4, and 5. When the value of N equals thirty one (31), the "divide by" value is sixty eight (68). When the value of N equals sixty two (62), the "divide by" value is sixty seven (67). When the value of N equals sixty one (61), the "divide by" value is sixty six (66). When the value of N is fifty nine (59), the "divide by" value is sixty five (65). Therefore, for this embodiment of the invention, the maximum allowed "divide by" value is sixty eight (68) and the minimum allowed "divide by" value is six (6).

The advantageous embodiment of the present invention shown in FIG. 1 and FIG. 2 is capable of utilizing 0.18 micron process technology and standard flip flop circuits to operate in a frequency range of approximately six hundred megahertz (600 MHz) (i.e., six hundred million cycles per second) to approximately nine hundred megahertz (900 MHz) (i.e., nine hundred million cycles per second). The advantageous embodiment of the present invention shown in FIG. 1 and FIG. 2 is also capable of utilizing 0.18 micron process technology and custom designed flip flop circuits to operate in a frequency range of approximately one and two tenths gigahertz (1.2 GHz) (i.e., one billion two hundred million cycles per second) to approximately one and five tenths gigahertz (1.5 GHz) (i.e., one billion five hundred million cycles per second).

The advantageous embodiment of the invention shown in FIG. 1 and FIG. 2 is but one example of the apparatus and method of the present invention. The present invention may be extended to a linear feedback shift register having more than six (6) bits or less than six (6) bits where there are only two (2) bits in the polynomial equation. That is, the linear feedback shift register of the present invention comprises a linear feedback shift register that has n bits and a polynomial equation of R[m]+R[p] where n is an integer, and where m is an integer less than n, and where p is an integer less than n.

FIG. 3 schematically illustrates a timing diagram 300 showing an operation of the exemplary six (6) bit PLL clock divider circuit shown in FIG. 1 and FIG. 2.

In timing diagram 300 an input register N value designated as N[5:0] represents six (6) bits. Bit 5 is the most significant bit (MSB) and Bit 0 is the least significant bit (LSB). An N[5:0] value of 000011 has Bit 0 and Bit 1 equal to "1" and the remaining bits equal to "0". The CLK signal is the input clock signal to be divided. The R[5:0] signal represents the LFSR outputs. The signal FB represents the "feedback" signal. The signal LE represents the "load enable" signal. The signal PLFF[5:0] represents the "pre-load" flip flop outputs (six (6) bits) in the first row of FIG. 1. The signal PLFF[11:6] represents the "pre-load" flip flop outputs (six (6) bits) in the second row of FIG. 1.

As seen in timing diagram 300, in the first input clock cycle after the value of N is changed to 000011, the "pre-load" flip flops PLFF11 through PLFF6 contain 000011 (specifically, PLFF11 being N[5]=0, PLFF10 being N[4]=0, PLFF9 being N[3]=0, PLFF8 being N[2]=0, PLFF7 being N[1]=1, and PLFF6 being N[0]=1) and the "pre-load" flip flops PLFF5 through PLFF0 contain 000111 (specifically, PLFF5 being N[4]=0, PLFF4 being N[3]=0, PLFF3 being N[2]=0, PLFF2 being N[1]=1, PLFF1 being N[0]=1, and PLFF0 being N[4] XNORed N[5]=1) as the LE signal ("load enable") is "high" (i.e., logic "1") at the rising edge of the first input clock cycle. The LE signal is "low" at the fourth rising edge (with respect to N value change to 000011) of the input clock cycle and therefore the "pre-load" flip flops PLFF5 through PLFF0 contain the values 001111 (specifically, PLFF5 being N[3]=0, PLFF4 being N[2]=0, PLFF3 being N[1]=1, PLFF2 being N[0]=1, PLFF1 being N[4] XNORed N[5]=1, PLFF0 being N[3] XNORed N[4]=1) and the "pre-load" flip flops PLFF11 through PLFF6 contain the previous input clock cycle values of PLFF5 through PLFF0 respectively, which is 000111. This implies that the "pre-load" flip flop PLFF11 gets the previous input clock cycle value of corresponding "pre-load" flip flop PLFF5 and so on.

At the same fourth rising edge (with respect to N value change to 000011) of the input clock cycle, the first LFSR sequence is loaded into the six (6) linear feedback shift register units, LFSR5 through LFSR0, when the LE signal ("load enable") is "low" (i.e., logic "0") for the first time. This first LFSR sequence loaded into the six (6) linear feedback shift register units is the value contained in corresponding "pre-load" flip flops PLFF11 through PLFF6 in the previous input clock cycle, which is 000011. The "D" input of all the linear feedback shift register units LFSR5 through LFSR0 is the output from the corresponding "pre-load" flip flops, PLFF11 through PLFF6, when the LE signal ("load enable") is "low" (i.e., logic "0"). In this six (6) bit LFSR based PLL clock divider example, the LE signal is "low" for three successive input clock cycles.

On the fifth rising edge (with respect to N value change to 000011) of the input clock cycle, when the LE signal is "low" for the second successive clock cycle, "pre-load" flip flops PLFF11 through PLFF6 get the values from the previous clock cycle values of the corresponding "pre-load" flip flops PLFF5 through PLFF0, which is 001111. Specifically, PLFF11=0, PLFF10=0, PLFF9=1, PLFF8=1, PLFF7=1 and PLFF6=1.

On the same fifth rising edge (with respect to N value change to 000011) of the input clock cycle, the "pre-load" flip flops PLFF5 through PLFF0 retain their previous clock cycle values.

On the same fifth rising edge (with respect to N value change to 000011) of the input clock cycle, when the LE signal is "low" for the second successive clock cycle, linear feedback shift register units LFSR5 through LFSR0 get the values from the previous clock cycle values of the "pre-load" flip flops PLFF11 through PLFF6, which is 000111. Specifically, LFSR5=0, LFSR4=0, LFSR3=0, LFSR2=1, LFSR1=1, and LFSR0=1.

On the sixth rising edge (with respect to N value change to 000011) of the input clock cycle, when the LE signal is "low" for the third successive clock cycle, "pre-load" flip flops PLFF11 through PLFF6 retain their values. Also "pre-load" flip flops PLFF5 through PLFF0 retain their values on the sixth rising edge (with respect to N value change to 000011) of the input clock cycle, when the LE signal is "low" for the third successive input clock cycle. On the same sixth rising edge (with respect to N value change to 000011) of the input clock cycle, when the LE signal is "low" for the third successive clock cycle, linear feedback shift register units LFSR5 through LFSR0 get the values from the previous clock cycle values of the corresponding "pre-load" flip flops PLFF11 through PLFF6, which is 001111. Specifically, LFSR5=0, LFSR4=0, LFSR3=1, LFSR2=1, LFSR1=1, and LFSR0=1.

On the seventh rising edge (with respect to N value change to 000011) of the input clock cycle, when the LE signal is "high," the feedback signal (FB) becomes the output of the LFSR0 unit. On the same seventh rising edge (with respect to N value change to 000011) of the input clock cycle, the output of the LFSR1 unit is the same as the output of the LFSR0 unit in the previous clock cycle and so on.

This pattern repeats when the LE signal is "low" again. In this example where eleven (11) flip flop circuits are used to generate the "load enable" (LE) signal, the "load enable" (LE) signal will be "low" (i.e., logic "0") after five successive rising edges of the input clock from the time when the outputs R[3], R[2], R[1], and R[0] are all "high" (i.e., logic "1"), and the outputs R[4] and R[5] are "low" (i.e., logic "0").

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A linear feedback shift register of the type comprising a plurality of linear feedback shift register (LFSR) flip flop circuits and a plurality of linear feedback shift register (LFSR) multiplexers alternately coupled together, where an input of each LFSR flip flop circuit is coupled to an output of an LFSR multiplexer, and where an output of each LFSR flip flop circuit may be provided to an input of an LFSR multiplexer, said linear feedback shift register comprising:

a first set of pre-load flip flop (PLFF) circuits and a first set of pre-load flip flop (PLFF) multiplexers alternately coupled together, where an input of each pre-load flip flop (PLFF) circuit in said first set of pre-load flip flop (PLFF) circuits is coupled to an output of a pre-load flip flop (PLFF) multiplexer in said first set of pre-load flip flop (PLFF) multiplexers, and where an output of each pre-load flip flop (PLFF) circuit is coupled to an input of a pre-load flip flop (PLFF) multiplexer in a second set of pre-load flip flop (PLFF) multiplexers; and a second set of pre-load flip flop (PLFF) circuits alternately coupled together with said second set of pre-load flip flop (PLFF) multiplexers, where an input of each pre-load flip flop (PLFF) circuit in said second set of pre-load flip flop (PLFF) circuits is coupled to an output of a pre-load flip flop (PLFF) multiplexer in said second set of pre-load flip flop (PLFF) multiplexers, and where an output of each pre-load flip flop (PLFF) circuit in said second set of pre-load flip flop (PLFF) circuits is coupled to an input of an LFSR multiplexer.

2. A linear feedback shift register as claimed in claim 1 wherein said each of said first set of pre-load flip flop (PLFF) multiplexers has a first input coupled to one bit of an input register value and a second input coupled to another bit of said input register value; and wherein said each of said second set of pre-load flip flop (PLFF) multiplexers has a first input coupled to one bit of said input register value and a second input coupled to an output of a pre-load flip flop (PLFF) circuit of said first set of pre-load flip flop (PLFF) circuits.

3. A linear feedback shift register as claimed in claim 2 having n bits and a polynomial equation of R[m]+R[p] where m is an integer less than n and where p is an integer less than n wherein a pre-load flip flop (PLFF) multiplexer that is coupled to a first pre-load flip flop (PLFF) circuit in said first set of pre-load flip flop (PLFF) circuits has one input coupled to a value equal to N[m−1] XNORed with N[p−1] when a load enable signal coupled to said pre-load flip flop (PLFF) multiplexer is low and another input coupled to a value equal to N[m] XNORed with N[p] when said load enable signal coupled to said pre-load flip flop (PLFF) multiplexer is high.

4. A linear feedback shift register as claimed in claim 3 comprising a circuit in a feedback path of said linear feedback shift register, wherein said circuit is capable of performing an exclusive NOR function on an output signal of one of said plurality of LFSR flip flop circuits and on an output signal of another one of said plurality of LFSR flip flop circuits in two pipeline stages.

5. A linear feedback shift register as claimed in claim 2 having six (6) bits and a polynomial equation of R[5]+R[4] wherein a pre-load flip flop (PLFF) multiplexer that is coupled to a first pre-load flip flop (PLFF) circuit in said first set of pre-load flip flop (PLFF) circuits has one input coupled to a value equal to N[3] XNORed with N[4] when a load enable signal coupled to said pre-load flip flop (PLFF) multiplexer is low and another input coupled to a value equal to N[4] XNORed with N[5] when said load enable signal coupled to said pre-load flip flop (PLFF) multiplexer is high.

6. A linear feedback shift register as claimed in claim 5 comprising a circuit in a feedback path of said linear feedback shift register, wherein said circuit is capable of performing an exclusive NOR function on an output signal of an LFSR3 flip flop circuit and on an output signal of an LFSR2 flip flop circuit of said plurality of LFSR flip flop circuits in two pipeline stages.

7. A linear feedback shift register as claimed in claim 6 wherein said circuit in said feedback path comprises:

a first flip flop circuit having an input connected to an output of a first NAND gate, said first NAND gate having a first input connected to an output of said LFSR2 flip flop circuit, and having a second input connected to an output of said LFSR3 flip flop circuit;

a second flip flop circuit having an input connected to a second NAND gate, said second NAND gate having a first input connected to an inverted version of said output of said LFSR2 flip flop circuit, and having a second input connected to an inverted version of said output of said LFSR3 flip flop circuit; and a third flip flop circuit having an input coupled to an output of a third NAND gate, said third NAND gate having a first input connected to an output of said first flip flop circuit, and having a second input connected to an output of said second flip flop circuit, said third flip flop circuit having an output coupled to said feedback path.

8. A linear feedback shift register as claimed in claim 3 wherein each linear feedback shift register (LFSR) multiplexer and each pre-load flip flop (PLFF) multiplexer has an enable signal input line connected to a load enable circuit that provides a load enable signal that is low for three input clock cycles.

9. A linear feedback shift register as claimed in claim 8 wherein said first set of pre-load flip flop (PLFF) circuits and said second set of pre-load flip flop (PLFF) circuits load a pre-calculated linear feedback shift register (LFSR) sequence into said plurality of linear feedback shift register (LFSR) flip flop circuits when said load enable signal is low; and wherein said plurality of linear feedback shift register (LFSR) flip flop circuits receive input values from a previous stage of said plurality of linear feedback shift register (LFSR) flip flop circuits when said load enable signal is high.

10. A linear feedback shift register as claimed in claim 9 capable of operating in a frequency range from approximately six hundred million cycles per second (600 MHz) to approximately nine hundred million cycles per second (900 MHz) where said linear feedback shift register utilizes 0.18 micron process technology and standard flip flop circuits for said pre-load flip flop (PLFF) circuits and for said linear feedback shift register (LFSR) flip flop circuits.

11. A linear feedback shift register as claimed in claim 9 capable of operating in a frequency range from approximately one billion two hundred million cycles per second (1.2 GHz) to approximately one billion five hundred million cycles per second (1.5 GHz) where said linear feedback shift register utilizes 0.18 micron process technology and custom designed flip flop circuits for said pre-load flip flop (PLFF) circuits and for said linear feedback shift register (LFSR) flip flop circuits.

12. A phase locked loop clock divider circuit comprising a linear feedback shift register of the type comprising a plurality of linear feedback shift register (LFSR) flip flop circuits and a plurality of linear feedback shift register (LFSR) multiplexers alternately coupled together, where an input of each LFSR flip flop circuit is coupled to an output of an LFSR multiplexer, and where an output of each LFSR flip flop circuit may be provided to an input of an LFSR multiplexer, said linear feedback shift register comprising:

a first set of pre-load flip flop (PLFF) circuits and a first set of pre-load flip flop (PLFF) multiplexers alternately coupled together, where an input of each pre-load flip flop (PLFF) circuit in said first set of pre-load flip flop (PLFF) circuits is coupled to an output of a pre-load flip flop (PLFF) multiplexer in said first set of pre-load flip flop (PLFF) multiplexers, and where an output of each pre-load flip flop (PLFF) circuit is coupled, to an input of a pre-load flip flop (PLFF) multiplexer in a second set of pre-load flip flop (PLFF) multiplexers;

a second set of pre-load flip flop (PLFF) circuits alternately coupled together with said second set of pre-load flip flop (PLFF) multiplexers, where an input of each pre-load flip flop (PLFF) circuit in said second set of pre-load flip flop (PLFF) circuits is coupled to an output of a pre-load flip flop (PLFF) multiplexer in said second set of pre-load flip flop (PLFF) multiplexers, and where an output of each pre-load flip flop (PLFF) circuit in said second set of pre-load flip flop (PLFF) circuits is coupled to an input of an LFSR multiplexer.

13. A phase locked loop clock divider circuit as claimed in claim 12 wherein said each of said first set of pre-load flip flop (PLFF) multiplexers has a first input coupled to one bit of an input register value and a second input coupled to another bit of said input register value; and wherein said each of said second set of pre-load flip flop (PLFF) multiplexers has a first input coupled to one bit of said input register value and a second input coupled to an output of a pre-load flip flop (PLFF) circuit of said first set of pre-load flip flop (PLFF) circuits.

14. A phase locked loop clock divider circuit as claimed in claim 13 having n bits and a polynomial equation of R[m]+R[p] where m is an integer less than n and where p is an integer less than n wherein a pre-load flip flop (PLFF) multiplexer that is coupled to a first pre-load flip flop (PLFF) circuit in said first set of pre-load flip flop (PLFF) circuits has one input coupled to a value equal to N[m−1] XNORed with N[p−1] when a load enable signal coupled to said pre-load flip flop (PLFF) multiplexer is low and another input coupled to a value equal to N[m] XNORed with N[p] when said load enable signal coupled to said pre-load flip flop (PLFF) multiplexer is high.

15. A phase locked loop clock divider circuit as claimed in claim 14 comprising a circuit in a feedback path of said linear feedback shift register, wherein said circuit is capable of performing an exclusive NOR function on an output signal of one of said plurality of LFSR flip flop circuits and on an output signal of another one of said plurality of LFSR flip flop circuits in two pipeline stages.

16. A phase locked loop clock divider circuit as claimed in claim 13 comprising a linear feedback shift register having six (6) bits and a polynomial equation of R[5]+R[4] wherein a pre-load flip flop (PLFF) multiplexer that is coupled to a first pre-load flip flop (PLFF) circuit in said first set of pre-load flip flop (PLFF) circuits has one input coupled to a value equal to N[3] XNORed with N[4] when a load enable signal coupled to said pre-load flip flop (PLFF) multiplexer is low and another input coupled to a value equal to N[4] XNORed with N[5] when said load enable signal coupled to said pre-load flip flop (PLFF) multiplexer is high.

17. A phase locked loop clock divider circuit as claimed in claim 16 comprising a circuit in a feedback path of said linear feedback shift register, wherein said circuit is capable of performing an exclusive NOR function on an output signal of an LFSR3 flip flop circuit and on an output signal of an LFSR2 flip flop circuit of said plurality of LFSR flip flop circuits in two pipeline stages.

18. A phase locked loop clock divider circuit as claimed in claim 17 wherein said circuit in said feedback path comprises:
   a first flip flop circuit having an input connected to an output of a first NAND gate, said first NAND gate having a first input connected to an output of said LFSR2 flip flop circuit, and having a second input connected to an output of said LFSR3 flip flop circuit;
   a second flip flop circuit having an input connected to a second NAND gate, said second NAND gate having a first input connected to an inverted version of said output of said LFSR2 flip flop circuit, and having a second input connected to an inverted version of said output of said LFSR3 flip flop circuit; and
   a third flip flop circuit having an input coupled to an output of a third NAND gate, said third NAND gate having a first input connected to an output of said first flip flop circuit, and having a second input connected to an output of said second flip flop circuit, said third flip flop circuit having an output coupled to said feedback path.

19. A phase locked loop clock divider circuit as claimed in claim 14 wherein each linear feedback shift register (LFSR) multiplexer and each pre-load flip flop (PLFF) multiplexer has an enable signal input line connected to a load enable circuit that provides a load enable signal that is low for three input clock cycles.

20. A phase locked loop clock divider circuit as claimed in claim 19 wherein said first set of pre-load flip flop (PLFF) circuits and said second set of pre-load flip flop (PLFF) circuits load a pre-calculated linear feedback shift register (LFSR) sequence into said plurality of linear feedback shift register (LFSR) flip flop circuits when said load enable signal is low; and
   wherein said plurality of linear feedback shift register (LFSR) flip flop circuits receive input values from a previous stage of said plurality of linear feedback shift register (LFSR) flip flop circuits when said load enable signal is high.

21. A phase locked loop clock divider circuit as claimed in claim 20 capable of operating in a frequency range from approximately six hundred million cycles per second (600 MHz) to approximately nine hundred million cycles per second (900 MHz) where said linear feedback shift register utilizes 0.18 micron process technology and standard flip flop circuits for said pre-load flip flop (PLFF) circuits and for said linear feedback shift register (LFSR) flip flop circuits.

22. A phase locked loop clock divider circuit as claimed in claim 20 capable of operating in a frequency range from approximately one billion two hundred million cycles per second (1.2 GHz) to approximately one billion five hundred million cycles per second (1.5 GHz) where said linear feedback shift register utilizes 0.18 micron process technology and custom designed flip flop circuits for said pre-load flip flop (PLFF) circuits and for said linear feedback shift register (LFSR) flip flop circuits.

23. A method for providing a linear feedback shift register having n bits where n is an integer, said method comprising the steps of:
   alternately coupling together a plurality of linear feedback shift register (LFSR) flip flop circuits and a plurality of linear feedback shift register (LFSR) multiplexers, where an input of each LFSR flip flop circuit is coupled to an output of an LFSR multiplexer, and where an output of each LFSR flip flop circuit may be provided to an input of an LFSR multiplexer;
   alternately coupling together a first set of pre-load flip flop (PLFF) circuits and a first set of pre-load flip flop (PLFF) multiplexers, where an input of each pre-load flip flop (PLFF) circuit in said first set of pre-load flip flop (PLFF) circuits is coupled to an output of a pre-load flip flop (PLFF) multiplexer in said first set of pre-load flip flop (PLFF) multiplexers, and where an output of each pre-load flip flop (PLFF) circuit in said first set of pre-load flip flop (PLFF) circuits is coupled to an input of a pre-load flip flop (PLFF) multiplexer in a second set of pre-load flip flop (PLFF) multiplexers;
   alternately coupling together a second set of pre-load flip flop (PLFF) circuits and a second set of pre-load flip flop (PLFF) multiplexers, where an input of each pre-load flip flop (PLFF) circuit in said second set of pre-load flip flop (PLFF) circuits is coupled to an output of a pre-load flip flop (PLFF) multiplexer in said second set of pre-load flip flop (PLFF) multiplexers, and where an output of each pre-load flip flop (PLFF) circuit in said second set of pre-load flip flop (PLFF) circuits is coupled to an input of an LFSR multiplexer;
   coupling an input register value bit to a first input of each pre-load flip flop (PLFF) multiplexer in said first set of pre-load flip flop (PLFF) multiplexers;
   coupling an input register value bit to a second input of each pre-load flip flop (PLFF) multiplexer in said first set of pre-load flip flop (PLFF) multiplexers;
   coupling an input register value bit to a first input of each pre-load flip flop (PLFF) multiplexer in said second set of pre-load flip flop (PLFF) multiplexers; and coupling to another input of each pre-load flip flop (PLFF) multiplexer in said second set of pre-load flip flop (PLFF) multiplexers an output of a pre-load flip flop (PLFF) circuit of said first set of pre-load flip flop (PLFF) circuits.

24. A method as claimed in claim 23 further comprising the steps of:

coupling to one input of a pre-load flip flop (PLFF) multiplexer that is coupled to a first pre-load flip flop (PLFF) circuit in said first set of pre-load flip flop (PLFF) circuits a value that is equal to N[m−1] XNORed with N[p−1] when a load enable signal coupled to said pre-load flip flop (PLFF) multiplexer is low, where said linear feedback shift register (LFSR) has a polynomial equation of R[m]+R[p] where m is an integer less than n and where p is an integer less than n;

coupling to another input of said pre-load flip flop (PLFF) multiplexer that is coupled to said first pre-load flip flop (PLFF) circuit in said first set of pre-load flip flop (PLFF) circuits a value that is equal to N[m] XNORed with N[p] when said load enable signal coupled to said pre-load flip flop (PLFF) multiplexer is high; and coupling to an input of an LFSR multiplexer a feedback signal generated by performing an exclusive NOR function on an output signal of one of said plurality of LFSR flip flop circuits and on an output signal of another one of said plurality of LFSR flip flop circuits in two pipeline stages.

25. A method as claimed in claim 24 where the value of n is six (6) and the value of m is five (5) and the value of p is (4).

26. A method as claimed in claim 25 wherein said step of coupling to an input of an LFSR multiplexer a feedback signal generated by performing an exclusive NOR function on an output signal of one of said plurality of LFSR flip flop circuits and on an output signal of another one of said plurality of LFSR flip flop circuits comprises the step of:

coupling to an input of an LFSR multiplexer a feedback signal generated by performing an exclusive NOR function on an output signal of an LFSR3 flip flop circuit and on an output signal of an LFSR2 flip flop circuit of said plurality of LFSR flip flop circuits in two pipeline stages.

27. A method as claimed in claim 24 further comprising the steps of:

coupling to an enable signal input line of each linear feedback shift register (LFSR) multiplexer and to an enable signal input line of each pre-load flip flop (PLFF) multiplexer a load enable signal that is low for three input clock cycles;

loading into said plurality of linear feedback shift register (LFSR) flip flop circuits from said first set of pre-load flip flop (PLFF) circuits and from said second set of pre-load flip flop (PLFF) circuits a pre-calculated linear feedback shift register (LFSR) sequence when said load enable signal is low; and loading into said plurality of linear feedback shift register (LFSR) flip flop circuits input values from a previous stage of said plurality of linear feedback shift register (LFSR) flip flop circuits when said load enable signal is high.

28. A method as claimed in claim 27 comprising the steps of:

fabricating said linear feedback shift register with 0.18 micron technology;

providing standard flip flop circuits for said pre-load flip flop (PLFF) circuits and for said linear feedback shift register (LFSR) flip flop circuits; and operating said linear feedback shift register within a frequency range from approximately six hundred million cycles per second (600 MHz) to approximately nine hundred million cycles per second (900 MHz).

29. A method as claimed in claim 27 comprising the steps of:

fabricating said linear feedback shift register with 0.18 micron technology;

providing custom designed flip flop circuits for said pre-load flip flop (PLFF) circuits and for said linear feedback shift register (LFSR) flip flop circuits; and operating said linear feedback shift register within a frequency range from approximately one billion two hundred million cycles per second (1.2 GHz) to approximately one billion five hundred million cycles per second (1.5 GHz).

* * * * *